United States Patent
Goh et al.

(10) Patent No.: US 11,114,421 B2
(45) Date of Patent: Sep. 7, 2021

(54) INTEGRATING SYSTEM IN PACKAGE (SIP) WITH INPUT/OUTPUT (IO) BOARD FOR PLATFORM MINIATURIZATION

(71) Applicant: Intel Corporation, Santa Clara, CA (US)

(72) Inventors: Eng Huat Goh, Ayer Itam (MY); Wee Hoe, Bayan Lepas (MY); Khang Choong Yong, Puchong (MY); Ping Ping Ooi, Butterworth (MY)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 16/546,280

(22) Filed: Aug. 20, 2019

(65) Prior Publication Data
US 2019/0378828 A1    Dec. 12, 2019

Related U.S. Application Data

(62) Division of application No. 15/777,458, filed as application No. PCT/US2015/067085 on Dec. 21, 2015, now Pat. No. 10,388,636.

(51) Int. Cl.
*H05K 1/00* (2006.01)
*H05K 1/02* (2006.01)
(Continued)

(52) U.S. Cl.
CPC .............. *H01L 25/16* (2013.01); *H01L 23/48* (2013.01); *H01L 23/5386* (2013.01);
(Continued)

(58) Field of Classification Search
CPC ... H05K 1/02; H05K 1/11; H05K 1/18; H05K 3/30; H05K 1/00; H01L 23/00;
(Continued)

(56) References Cited

U.S. PATENT DOCUMENTS 3,838,317 A    9/1974  Coyne
5,581,712 A   12/1996  Herrman
(Continued)

FOREIGN PATENT DOCUMENTS

WO    2016/118201 A1    7/2016
WO    2017/111903 A1    6/2017

OTHER PUBLICATIONS

International Preliminary Report on Patentability for International Application No. PCT/US2015/056650, dated Aug. 3, 2017, 9 pages.
(Continued)

*Primary Examiner* — Xiaoliang Chen
(74) *Attorney, Agent, or Firm* — Spectrum IP Law Group LLC

(57) ABSTRACT

Methods and apparatus relating to integrating System in Package (SiP) with Input/Output (IO) board for platform miniaturization are described. In an embodiment, a SiP board includes a plurality of logic components. An IO board is coupled to the SiP board via a grid array. The plurality of logic components is provided on both sides of the SiP board and one or more of the plurality of logic components are to be positioned in an opening in the IO board. Other embodiments are also disclosed and claimed.

17 Claims, 12 Drawing Sheets

(51) Int. Cl.
*H05K 1/11* (2006.01)
*H05K 1/18* (2006.01)
*H05K 3/30* (2006.01)
*H01L 23/00* (2006.01)
*H01L 23/36* (2006.01)
*H01L 23/48* (2006.01)
*H01L 23/64* (2006.01)
*H01L 23/495* (2006.01)
*H01L 23/498* (2006.01)
*H01L 25/16* (2006.01)
*H01L 25/18* (2006.01)
*H01L 25/065* (2006.01)
*H01L 23/538* (2006.01)
*H01L 25/00* (2006.01)
*H05K 1/14* (2006.01)

(52) U.S. Cl.
CPC ............ *H01L 25/065* (2013.01); *H01L 25/18* (2013.01); *H01L 25/50* (2013.01); *H05K 1/144* (2013.01); *H05K 1/147* (2013.01); *H05K 1/181* (2013.01); *H05K 3/303* (2013.01); *H01L 2924/1432* (2013.01); *H01L 2924/15311* (2013.01); *H01L 2924/15313* (2013.01); *H01L 2924/19042* (2013.01); *H01L 2924/19106* (2013.01); *H05K 2201/048* (2013.01); *H05K 2201/055* (2013.01); *H05K 2201/1003* (2013.01); *H05K 2201/10098* (2013.01); *H05K 2201/10151* (2013.01); *H05K 2201/10159* (2013.01); *H05K 2201/10356* (2013.01); *H05K 2201/10522* (2013.01); *H05K 2201/10545* (2013.01); *H05K 2201/10704* (2013.01); *H05K 2201/10719* (2013.01); *H05K 2201/10734* (2013.01)

(58) Field of Classification Search
CPC ......... H01L 23/36; H01L 23/48; H01L 23/64; H01L 23/495; H01L 23/498
USPC .......... 361/748, 679.47, 761, 763, 764, 783; 257/675, 686, 706, 738, 777; 174/254, 174/258, 261
See application file for complete search history.

(56) References Cited

U.S. PATENT DOCUMENTS

| | | | |
|---|---|---|---|
| 6,366,974 B1 | 4/2002 | Kung et al. | |
| 6,501,528 B1* | 12/2002 | Hamada | G02F 1/133305 |
| | | | 345/4 |
| 6,507,095 B1 | 1/2003 | Hashimoto | |
| 6,538,899 B1 | 3/2003 | Krishnamurthi et al. | |
| 8,776,037 B2 | 7/2014 | Gee et al. | |
| 9,806,044 B2* | 10/2017 | Hu | H01L 25/0657 |
| 10,037,946 B2* | 7/2018 | Hu | H01L 25/18 |
| 2001/0024198 A1* | 9/2001 | Oishi | H05K 7/20963 |
| | | | 345/204 |
| 2003/0042587 A1* | 3/2003 | Lee | H01L 25/0657 |
| | | | 257/678 |
| 2003/0183914 A1 | 10/2003 | Wallace | |
| 2004/0007771 A1 | 1/2004 | Shin et al. | |
| 2004/0227222 A1* | 11/2004 | Kikuchi | H01L 23/5386 |
| | | | 257/686 |
| 2005/0012199 A1* | 1/2005 | Rosenau | G02B 6/4281 |
| | | | 257/696 |
| 2006/0035492 A1 | 2/2006 | Sekido | |
| 2006/0101176 A1 | 5/2006 | Oh-Yang et al. | |
| 2006/0164891 A1 | 7/2006 | Mills et al. | |
| 2007/0075412 A1 | 4/2007 | Reid et al. | |
| 2007/0076369 A1 | 4/2007 | Chen et al. | |
| 2007/0166876 A1 | 7/2007 | Kim et al. | |
| 2007/0177308 A1 | 8/2007 | Kimura | |
| 2008/0106861 A1 | 5/2008 | Jafari et al. | |
| 2008/0224298 A1* | 9/2008 | Corisis | H01L 24/97 |
| | | | 257/690 |
| 2009/0200367 A1 | 8/2009 | Arnouse | |
| 2009/0279268 A1 | 11/2009 | Son et al. | |
| 2010/0302725 A1* | 12/2010 | Busch | G06F 1/20 |
| | | | 361/679.47 |
| 2011/0141712 A1 | 6/2011 | You et al. | |
| 2011/0147919 A1* | 6/2011 | Sutardja | H01L 23/3128 |
| | | | 257/706 |
| 2011/0157832 A1 | 6/2011 | Hongo | |
| 2012/0153982 A1 | 6/2012 | Lee | |
| 2012/0192265 A1 | 7/2012 | Arnouse | |
| 2013/0127054 A1* | 5/2013 | Muthukumar | H01L 23/3121 |
| | | | 257/738 |
| 2013/0254705 A1 | 9/2013 | Moorning et al. | |
| 2013/0283070 A1 | 10/2013 | Jaussi et al. | |
| 2013/0343000 A1 | 12/2013 | Shi et al. | |
| 2014/0002989 A1 | 1/2014 | Ahuja et al. | |
| 2014/0002994 A1 | 1/2014 | Walczyk et al. | |
| 2014/0089688 A1 | 3/2014 | Man et al. | |
| 2014/0175636 A1 | 6/2014 | Roy et al. | |
| 2014/0237142 A1 | 8/2014 | Jaussi et al. | |
| 2014/0240650 A1* | 8/2014 | Motooka | G02F 1/13452 |
| | | | 349/110 |
| 2015/0021754 A1 | 1/2015 | Lin et al. | |
| 2015/0022985 A1* | 1/2015 | Na | H01L 23/50 |
| | | | 361/763 |
| 2015/0084170 A1* | 3/2015 | Im | H01L 23/49833 |
| | | | 257/675 |
| 2015/0091149 A1* | 4/2015 | Jang | H01L 23/49811 |
| | | | 257/686 |
| 2015/0130041 A1* | 5/2015 | Seo | H01L 23/5389 |
| | | | 257/686 |
| 2015/0216053 A1* | 7/2015 | Sauer | H01L 25/0652 |
| | | | 361/783 |
| 2016/0216731 A1 | 7/2016 | Goh et al. | |
| 2018/0191053 A1 | 7/2018 | Ndip et al. | |
| 2018/0331081 A1* | 11/2018 | Goh | H01L 23/48 |

OTHER PUBLICATIONS

Office Action and Search Report with translation of Search Report in Taiwan Application No. 104140942 dated Mar. 1, 2017, 10 pages.
International Search Report and Written Opinion for PCT Application No. PCT/US2015/056650, dated Feb. 3, 2016, 12 pages.
Office Action issued in U.S. Appl. No. 14/604,531, dated Jun. 3, 2016, 15 pages.
Office Action issued in U.S. Appl. No. 14/604,531, dated Jul. 28, 2017, 13 pages.
Office Action issued in U.S. Appl. No. 14/604,531, dated Oct. 26, 2016, 16 pages.
Office Action issued in U.S. Appl. No. 14/604,531, dated Feb. 22, 2018, 13 pages.
International Search Report and Written Opinion received for International Application No. PCT/US2015/067085, dated Aug. 24, 2016, 13 pages.

* cited by examiner

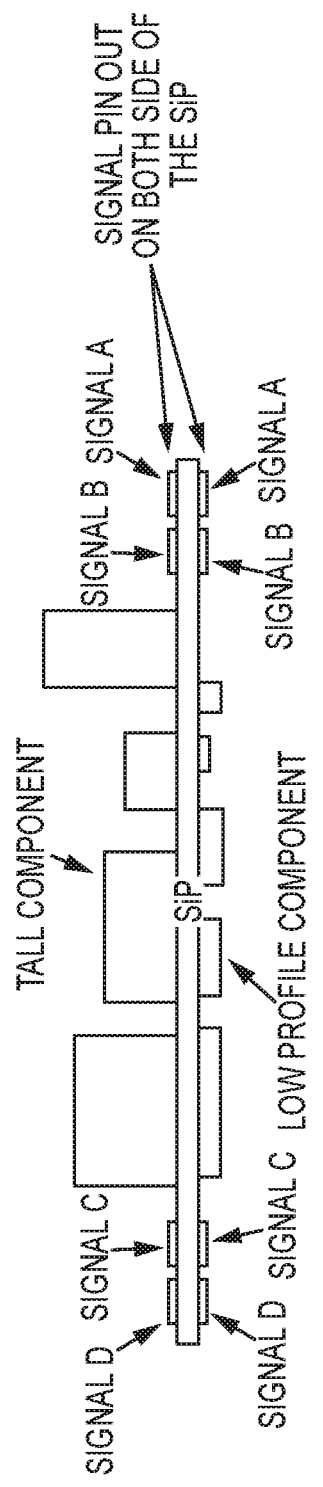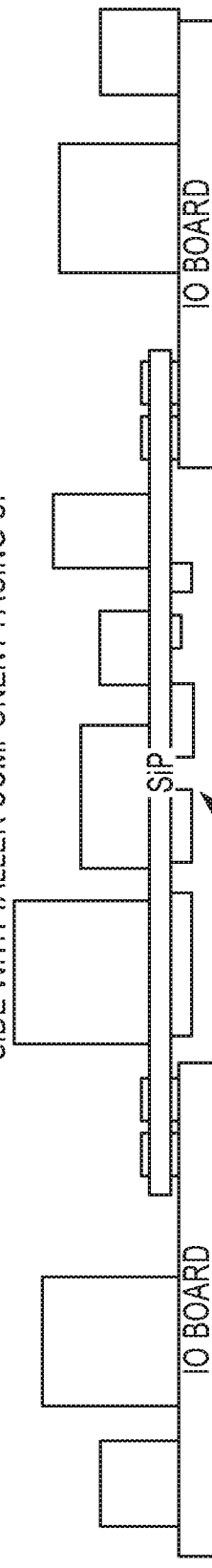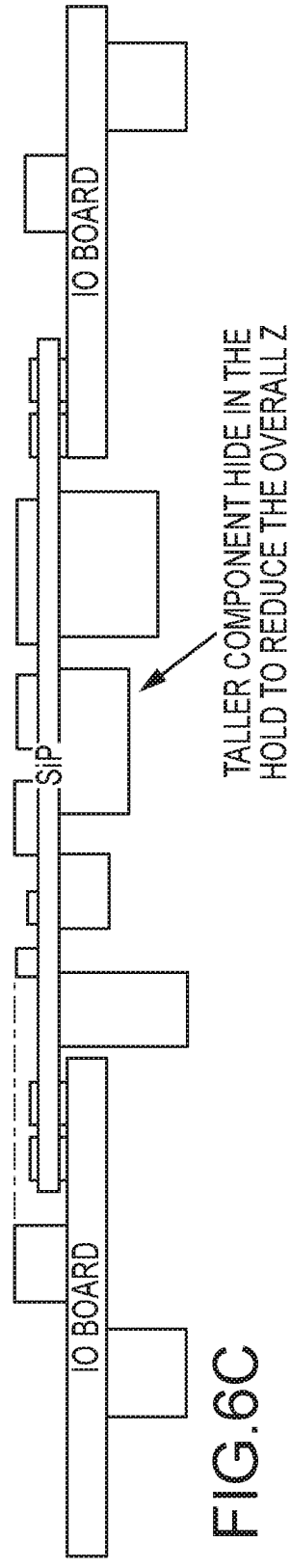

INTEGRATING SYSTEM IN PACKAGE (SIP) WITH INPUT/OUTPUT (IO) BOARD FOR PLATFORM MINIATURIZATION

RELATED APPLICATIONS

This application is a divisional under 35 U.S.C. § 121 of and claims priority under 35 U.S.C. § 120 to U.S. patent application Ser. No. 15/777,458, filed May 18, 2018, entitled "INTEGRATING SYSTEM IN PACKAGE (SIP) WITH INPUT/OUTPUT (IO) BOARD FOR PLATFORM MINIATURIZATION" which in turn claims priority under 35 U.S.C. § 371 to International Application No. PCT/US2015/067085, filed Dec. 21, 2015, entitled "INTEGRATING SYSTEM IN PACKAGE (SIP) WITH INPUT/OUTPUT (IO) BOARD FOR PLATFORM MINIATURIZATION." The entire disclosure(s) of these documents are hereby incorporated by reference herein for all purposes.

FIELD

The present disclosure generally relates to the field of electronics. More particularly, an embodiment relates to integrating System in Package (SiP) with Input/Output (IO) board for platform miniaturization.

BACKGROUND

Due to their size and portability, small form factor mobile devices are quickly becoming common-place. However, as the popularity of such devices grows, the expectation that they would perform as well as non-mobile device also increases. Hence, there is a general need to both increase the capabilities (or functional components) and decrease the overall size of such mobile devices.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

FIGS. 2, 3, 4, 5, 6A, 6B, 6C, 7A, 7B, and 7C illustrate various views of SiP devices and components, according to some embodiments.

DETAILED DESCRIPTION

Figure 1A:
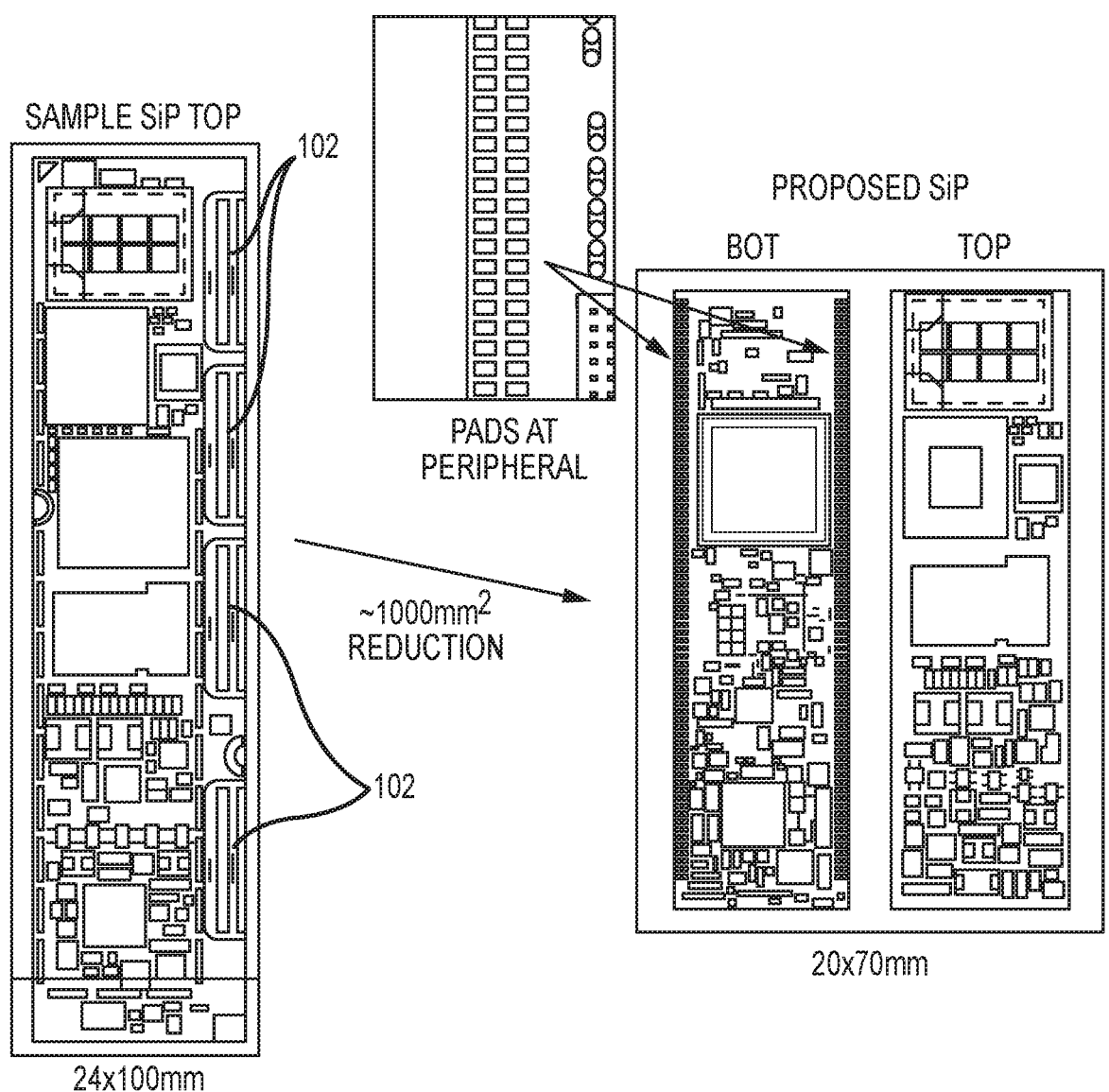
FIG. 1A is a block diagram of a miniaturized sample SiP board, according to an embodiment.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, there is a general need to both increase the capabilities (or functional components) and decrease the overall size of mobile computing devices. To this end, some embodiments integrate System in Package (SiP) board/device with an Input/Output (IO) board for platform miniaturization. More particularly, an embodiment provides an innovative way to couple a SiP and IO board, which is low cost, electrically and/or mechanical robust, and/or without XYZ trade off (e.g., compared to a conventional single board design approach). This allows a more complete utilization of real estate savings gained by a SiP solution. As discussed herein, "XYZ" generally refers to the three dimensional space formed by a shape extended along an X axis, a Y axis, and a Z axis.

Moreover, techniques discussed herein may be utilized for various computing systems (e.g., including a non-mobile computing device such as a desktop, workstation, server, rack system, etc. or a mobile computing device such as a smartphone, tablet, phablet, UMPC (Ultra-Mobile Personal Computer), laptop computer, Ultrabook™ computing device, wearable devices (such as a smart watch, smart glasses, a smart bracelet, etc.), or the like, including those discussed with reference to FIGS. 1-11.

SiP can be used to miniaturize the overall size of mobile computing devices and make such devices fit-able into a small form factor such as those discussed herein, including a phone or a phablet. In accordance with some embodiments (e.g., and from a cost and business model perspective), one or more core components (e.g., CPU (Central Processing Unit) or processor, PCH (Peripheral Controller Hub), memory (e.g., Dynamic Random Access Memory or DRAM), BIOS (Basic Input Output System) flash memory, and/or power delivery subsystem) may be included on the SiP board while other subsystem(s) or IO(s) (e.g., with larger) connectors (such as a camera or sensor(s), HDMI (High Definition Multimedia Interface), DP (Display Port), USB (Universal Serial Bus), etc.) may be placed on a PCB (Printed Circuit Board) or a motherboard. This in turn leads to the need for an XYZ optimized, electrically robust, and/or cost effective solution to couple the SiP and an IO board. Some techniques for coupling a SiP and an IO board may either via connectors (FPC (Flexible Printed Circuit) or board-to-board) or direct soldering of the SiP (e.g., with BGA (Ball Grid Array)) on top of the IO board. Such techniques however are not always XYZ effective and may compromise the benefits gained by utilization of SiP as further discussed herein.

FIG. 1A is a block diagram of a miniaturized sample SiP board, according to an embodiment. For example, a sample SiP solution (shown on the left side of FIG. 1) may include four FPC connectors (102) which use flex cables (not shown) to bridge the SiP and the IO board. The proposed SiP (bottom (Bot) and top portions) are shown on the right side of FIG. 1, with an enlarged picture of pads at the peripheral of the proposed SiP in the top, middle portion of FIG. 1. This ample SiP solution on the left however is not XY dimension or cost and electrically friendly. While the FPC connectors can be costly (e.g., 50-80 cents each), a large real estate (e.g., 100 mm$^2$ each) is used to house these connectors for the SiP and IO board which compromises the area saving gained by utilization of the SiP.

In addition, flex cables can be electrically lossy, thus compromising the signal integrity quality of the IO busses or signals running through the cables. Hence, by utilizing the proposed SiP, a real estate reduction of about 1000 mm$^2$ may be achieved (when comparing a 24×100 mm board and the proposed SiP 20×70 mm as shown). This is achieved due to elimination of the FPC connectors and also by moving components (e.g., with less than about 0.9 mm size) towards the secondary side. Furthermore, the pads may be used for an LGA (Land Grid Array) design in some embodiments; however, embodiments are not limited to LGA usage and may utilize one or more other types of grid arrays (in addition to or instead of LGA), such as BGA, PGA (Pin Grid Array), SGA (Solder Grid Array), etc.

Figure 1B:
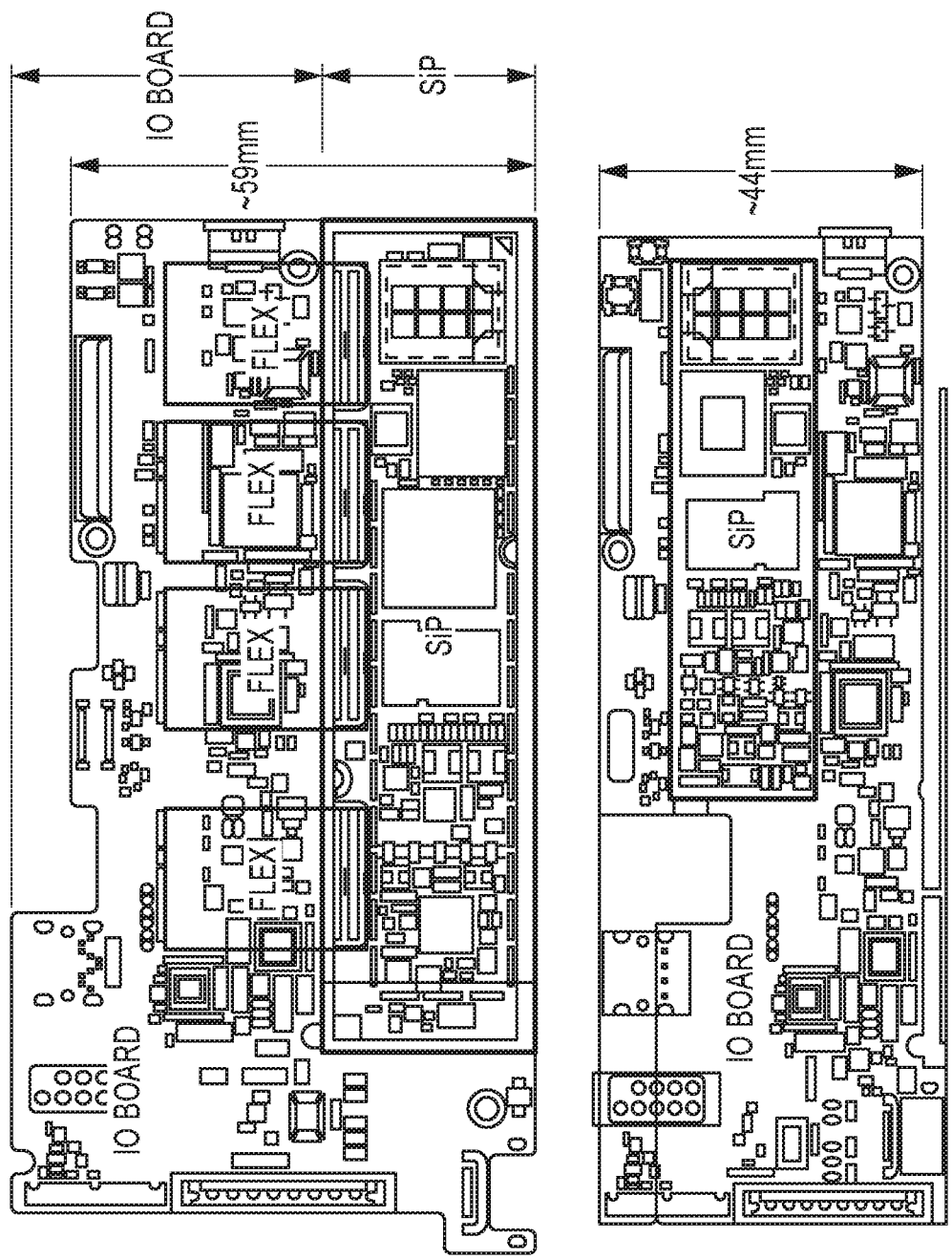
FIG. 1B illustrate a block diagram of a miniaturized combined SiP and IO board, according to one embodiment.

FIG. 1B illustrate a block diagram of a miniaturized combined SiP and IO board, according to one embodiment. As illustrated, the sample show in the upper portion of FIG. 1B may be significantly larger than the proposed stacked board shown in the bottom portion of FIG. 1B (e.g., about 25% larger with a 44 mm vs. 59 mm size comparison). In the top board, a total of eight FPC connectors (two for each flex cable) are used to interconnect the SiP to the IO board which ultimately compromises the real estate saving of using SiP.

Hence, some embodiments provide one or more of the following features: (1) eliminate the need for FPC connectors or flex cables which can save costs and XY dimension; (2) reduce the SiP package size while not scarifying the overall module Z dimension; (3) provide better electrical performance due to the elimination of the flex cable(s) which can degrade signal propagation; and/or (4) provide space for a larger battery due to the space savings achieved with the combination of SiP and IO board. Moreover, as shown in FIG. 1B, combining the IO board in accordance with one embodiment, about 15 mm reduction is gained in the overall SiP plus IO board Y dimension. And, this makes more space available, e.g., for a larger battery capacity to be fit into the platform.

Figure 2:
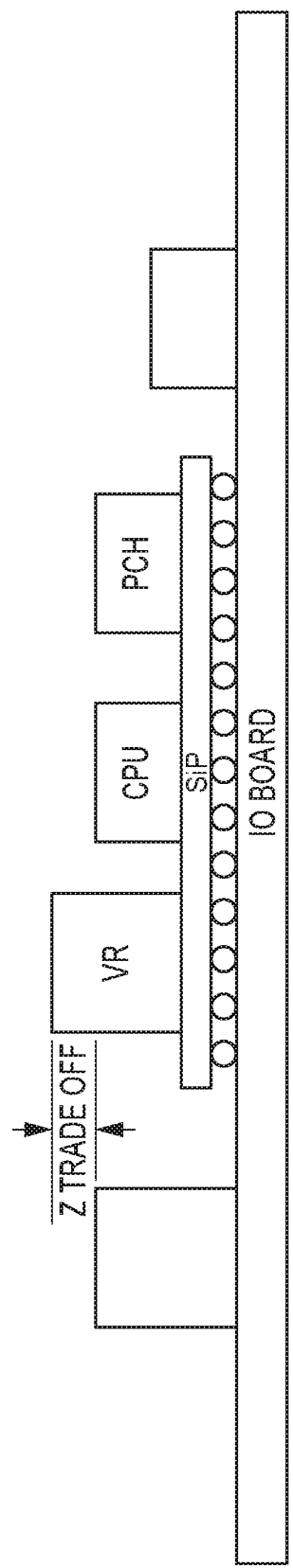

Moreover, FIG. 2 shows SiP stacking on the IO board using BGA. While in some cases, SiP may be directly stacked on top of an IO board via a BGA interconnect (as in FIG. 2), this method may pose a trade off with Z dimension impact as illustrated in FIG. 2. By contrast, some embodiments solve the above mentioned issue such as discussed herein. More specifically, with the stacking architecture discussed herein, all (or at least most) portions of available space on the primary side of SiP/IO board can be used for component placement; thus, incurring no real estate waste or penalty due to the interconnection. And, full benefits of using SiP may be realized as discussed herein. Also, there is no Z dimension height penalty by either stacking the SiP on IO board or by using a double-sided design on the SiP when compared to conventional methods.

For example, some embodiments can achieve smaller overall XYZ dimension by applying one or more of the following: (a) optimize the Z dimension of SiP components such that the tallest component on the SiP is not exceeding the tallest component on the IO board post stacking (which is feasible with the Direct Chip Attached (DCA) capability available on the SiP); (b) use an LGA as the solder interconnect between SiP and IO board (in an embodiment, LGA is proposed as the interconnect due to its low standoff, e.g., less than about 0.1 mm; thus, not compromising the overall component plus PCB (Printed Circuit Board) Z dimension post stacked); (c) provide LGA usage toward the package peripheral on the secondary side, while allowing component(s) placed on the secondary side within the LGA cavity to reduce overall SiP size (compared to a single-sided design); and/or (d) a cut-out on the motherboard or PCB (in the IO board) to allow the secondary side component(s) on the SiP to be fitted inside the hole or cavity (formed by the cut-out) without impacting the overall board or SiP thickness (e.g., compared to a single-side design which is generally used to meet the system Z dimension goals). Alternatively, the cavity or hole may be formed by arrangement of various sections of the motherboard or PCB instead of or in addition to a cut-out.

Figure 3:
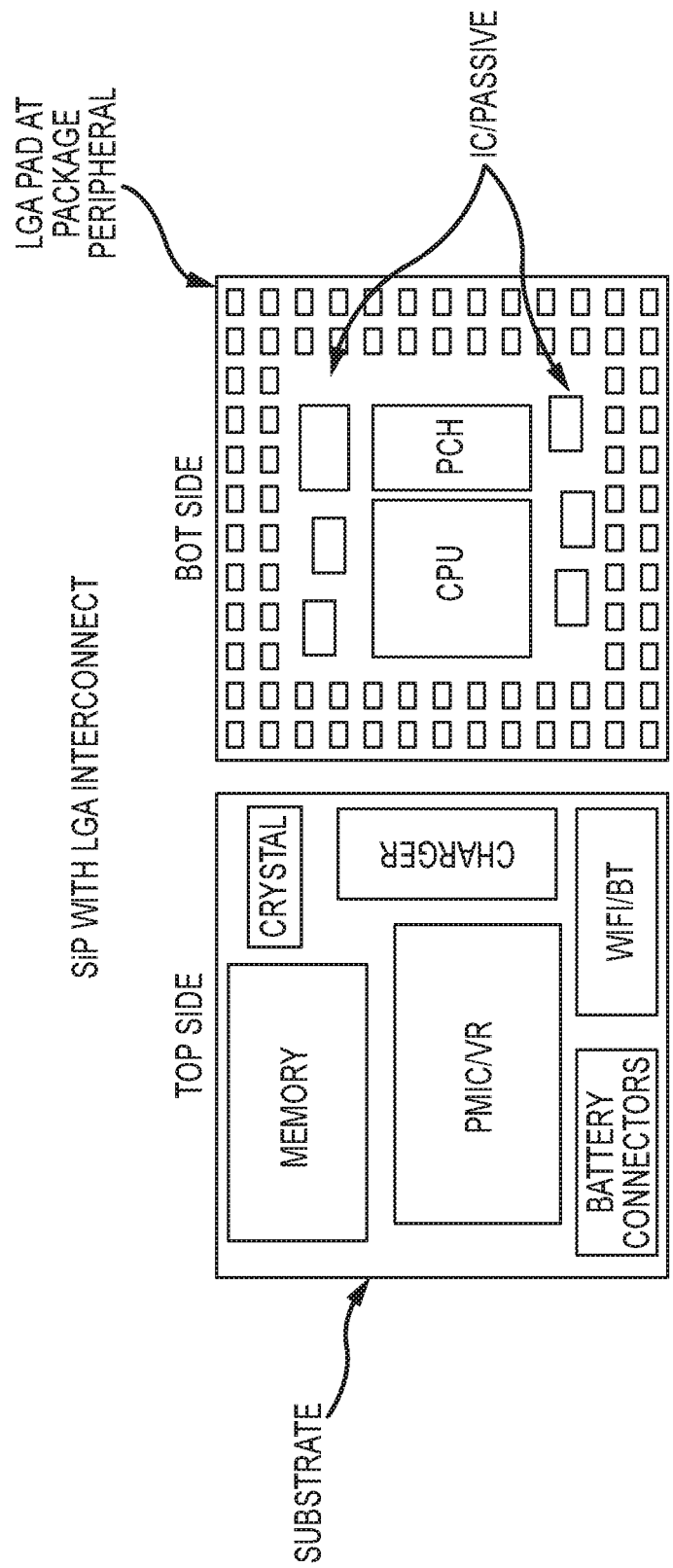

FIG. 3 illustrates a top view of top (or primary) and bottom (or secondary) sides of a SiP device, according to an embodiment. As shown, an LGA interconnect is used at the package peripheral on the secondary (or bottom) side. Generally, low Z dimension component(s) (e.g., about 0.8 mm to 0.9 mm in Z dimension) are placed on the secondary side of the SiP within the LGA cavity. One or more components (such as Voltage Regulator (VR), PMIC (Power Management Integrated Circuit), graphics logic (such as GPU (Graphics Processing Unit), crystal (xtal), memory, battery connectors, battery charger, WiFi (Wireless Fidelity), BT (Bluetooth(r)), etc.) are provided on the top side. Moreover, since the majority of the CPU/PCH signals are already coupled within the SiP, only a small portion of the signals are to be routed to the IO board (e.g., about 250-300 signals or power components are present when compared with some implementations that may utilize over 1000 such signals). With that, 2-3 rows of LGA pad along the package peripheral may be sufficient to accommodate all IO signal needs and the remaining center area on the bottom/secondary side can then be used for component placement. A cut out in motherboard/PCB is used to accommodate or fit these secondary side components to reduce overall dimensions as discussed herein.

Accordingly, in some embodiments one or more of the following features may be provided: (1) SiP with core component(s) (such as CPU/processor, PCH, memory, power delivery subsystem, etc.) placed on both primary and secondary sides (where the height of the component(s) on both primary and secondary sides of the SiP can be optimized such that the overall thickness of the SiP does not exceed Z dimention of the tallest component on IO board); (2) SiP is used with an LGA pad at the peripheral of the secondary side which will be soldered to the corresponding pad on the IO board (in an embodiment, LGA as the soldering technique due to its relatively lower standoff (e.g., less than about 0.1 mm); thus, not compromising the overall (component plus PCB) Z dimension for the proposed SiP-motherboard stacked architecture); (3) a cut out on the motherboard/PCB (for the IO board) allowing secondary side component(s) on the SiP to be fitted inside the hole formed by the cut out.

Figure 4:
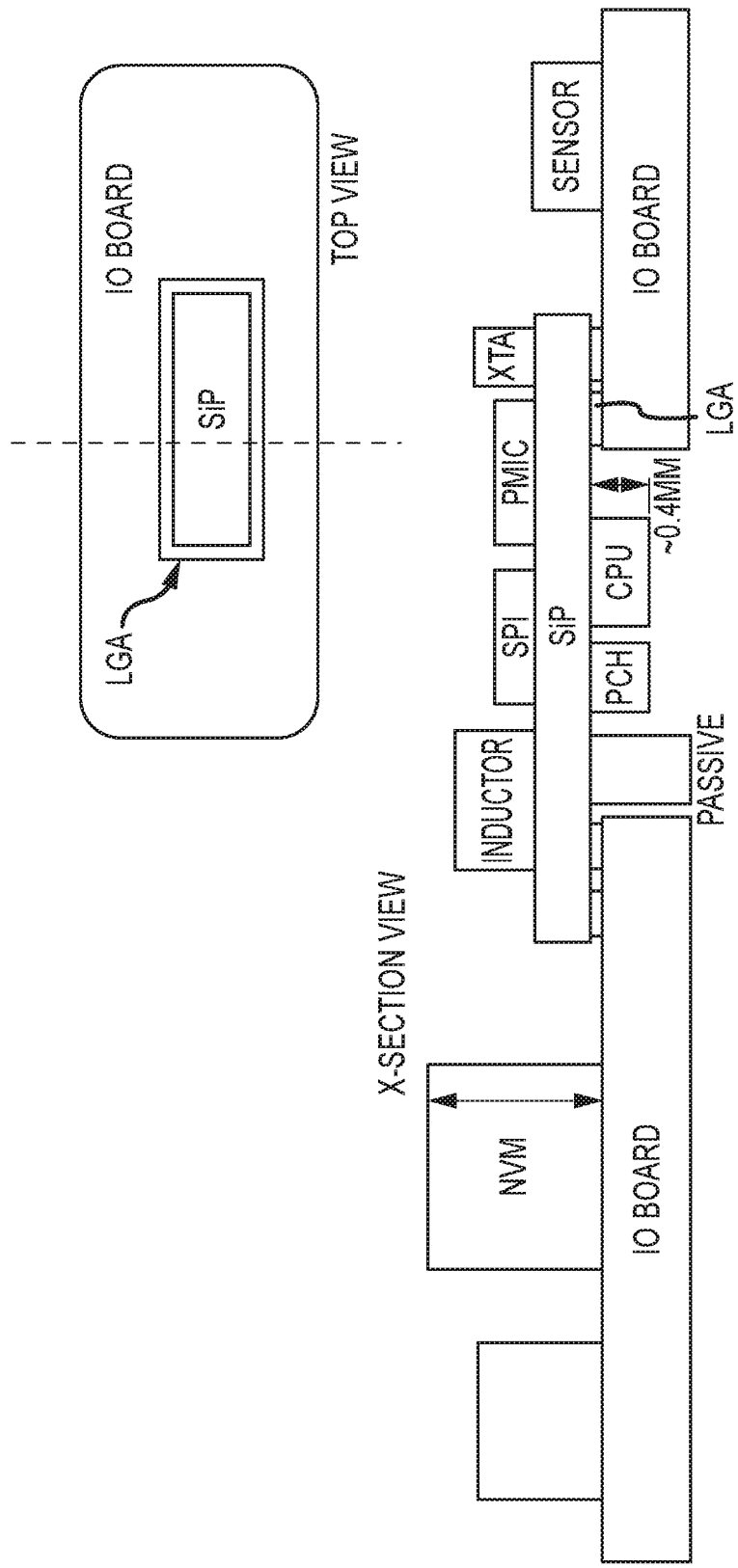

FIG. 4 shows top and cross-sectional view of a SiP, according to some embodiments. As illustrated, the SiP can be mounted or stacked on an IO board with a cut-out on the motherboard/PCB to accommodate secondary side component(s) on the SiP. Such an SiP-IO board stacked architecture has no impact on the overall module Z dimension due to: (1) placement and type of component(s) on the SiP are selected such that the tallest component on the SiP is shorter than one or more of the tallest component(s) on IO board (e.g., SSD, battery or USB type C connector(s), WiFi module, BT module, etc.); and/or (2) one or more of the components on the secondary side are hidden or fitted in the hole formed by a cut out in the motherboard/PCB. Also as shown in FIG. 4, IO board may include NVM (or Non-Volatile Memory, such as 3-dimensional cross-point memory) and/or one or more sensors (e.g. to detect variations in temperature, operating frequency, voltage, power consumption, etc.). Also, the SiP board may include SPI (Serial Peripheral Interface) logic, one or more inductors, one or more passive or IC component(s) (as shown in FIG. 3 also), xtal (which generally refers to "crystal", one or more of which generate the clock signal(s) supplied to the circuitry in the platform), etc.

Figure 5:
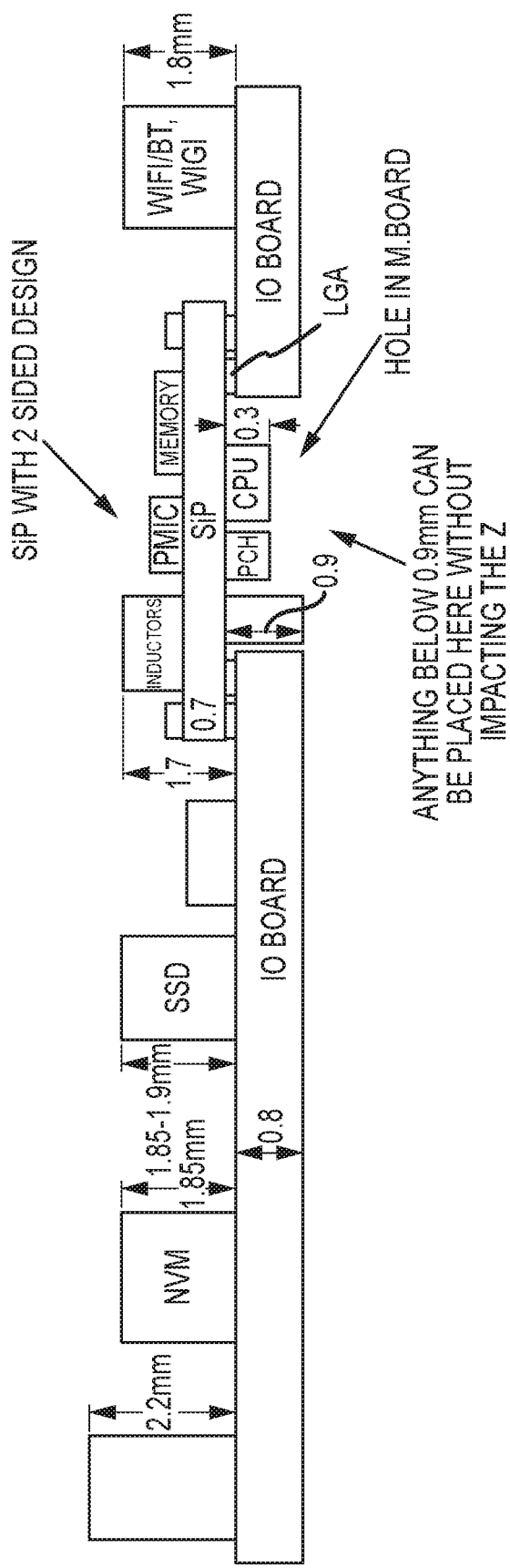

FIG. 5 shows the Z height of a few components on the platform, according to an embodiment. The SiP Z dimension of about 1.7 (above the IO board) is still equal or shorter than the tallest component (e.g., SSD, WiFi/BT module) on the IO board. Further, the ability to provide a double sided design on the SiP allows shrinkage in the overall SiP package size (versus a single sided design) which can also result in an overall smaller board area.

According to some embodiments: (a) the need for FPC connectors/flex cables can be eliminated/reduced which saves cost and XY dimension; (b) the SiP overall package size can be reduced while not scarifying the overall module Z dimension; (c) better electrical performance or signal integrity can be achieved with the elimination of the flex cables which are lossy; and/or (d) a larger battery may be use for the system due to smaller combined SiP and IO board size.

In an embodiment, a first manufacturer may provide an SiP with one or more components (such as CPU, PCH, PMIC, etc.) on one or both sides of the SiP. This SiP may then be provided to a second manufacturer (e.g., after testing) to either couple the SiP with an IO board and/or add one or more other components on the SiP and/or IO board. This approach provides flexibility to both manufactures as each only needs to own the inventory for a subset of components/boards. Also, depending on the implementation, the second manufacturer may include a plurality of manufactures that in turn provides the possibility for a wider variety of end/consumer products.

FIGS. 6A, 6B, and 6C illustrate side view of SiP components according to some embodiments. More specifically, FIG. 6A illustrates a side view of a SiP device with components mounted on both sides. As shown, low profile component(s) may be coupled on one side (e.g., bottom) of the SiP, while taller component(s) are provided on a different side (e.g., top) of the SiP. Signal pin out may be provided on both sides of the SiP as shown. In an embodiment, the same signals may be provided on both sides of the SiP.

FIGS. 6B and 6C illustrate side views of single-sided and double-sided SiP and IO board designs, respectively. As shown in FIG. 6B, the SiP may include components mounted on both sides, while the IO board only includes components on one side. Hence, the SiP of FIG. B may be the same or similar to the SiP shown and discussed with reference to FIG. 6A. By contrast, the embodiment of FIG. 6C includes components on both sides of the SiP as well as the IO board. Taller SiP components may be provided in the hole formed by the IO board cut out as shown in FIG. 6C and discussed herein. Moreover, the specific design may be chosen based on component type and/or vendor, e.g., to support differing end/consumer products or features.

Figure 7A:
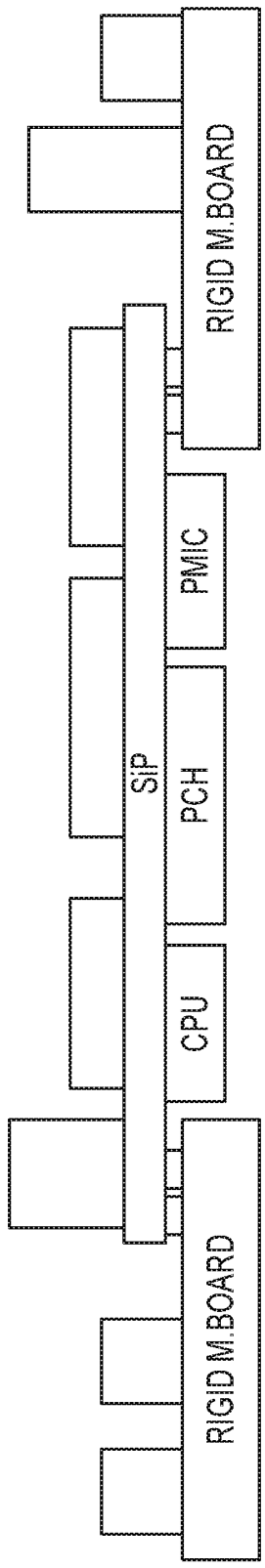
Figure 7B:
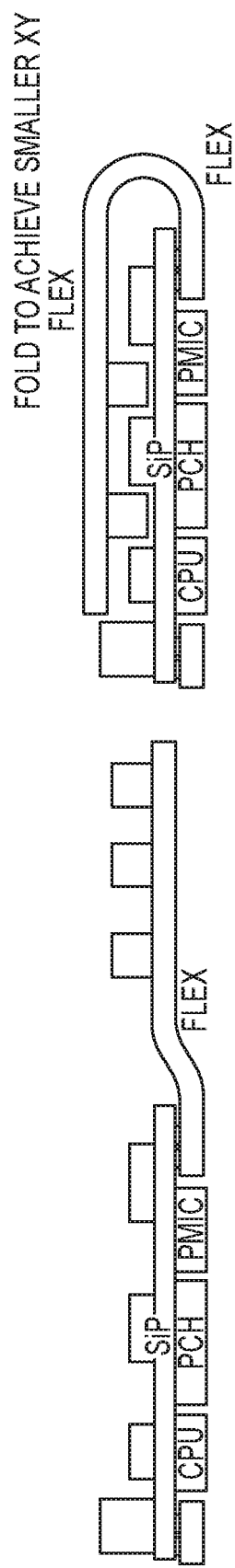
Figure 7C:
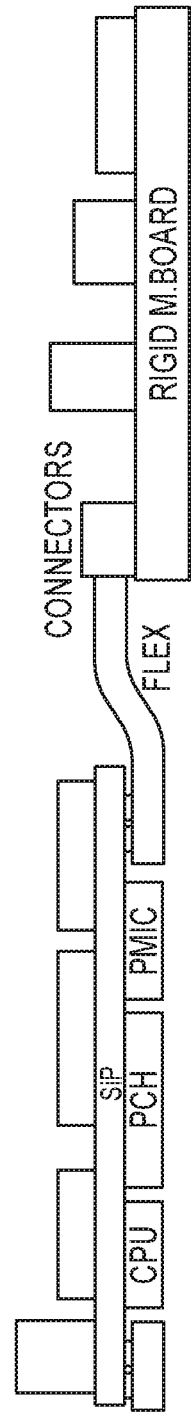

FIGS. 7A, 7B, and 7C illustrate multiple ways to couple a SiP to an IO board or other components, according to some embodiments. In FIGS. 7A-7C, the IO board is more generally labeled as rigid motherboard (or M.board). As shown in FIGS. 7B and 7C, flex cable(s) may be used to provide electrical couplings between various components. Also, the flex cable(s) may be folded to achieve better XY dimensions.

Figure 8:
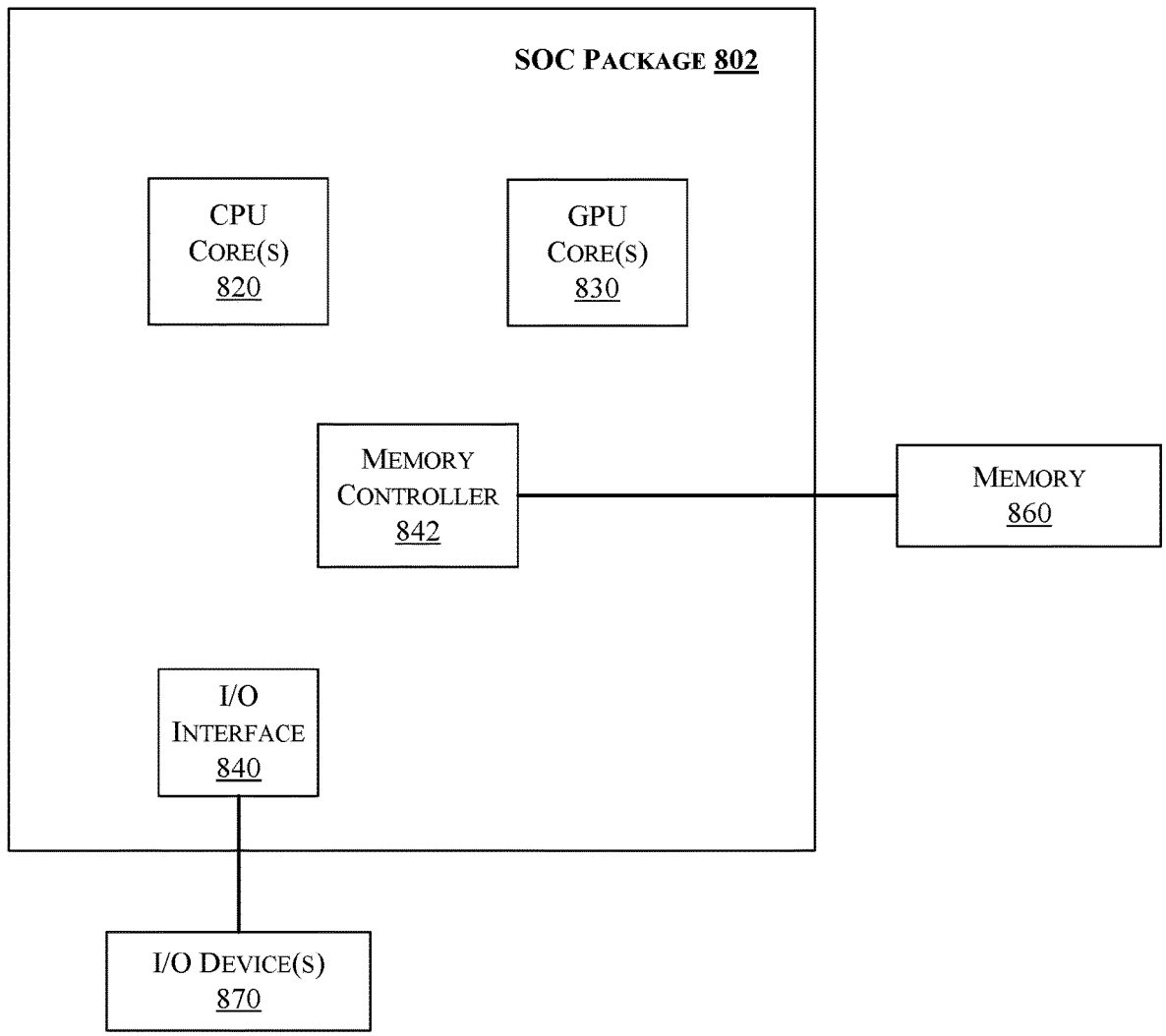
FIGS. 8 and 9 illustrate block diagrams of embodiments of computing systems, which may be utilized in various embodiments discussed herein.

In some embodiments, various computing systems (such as those discussed with reference to FIGS. 8-11) may include a SiP integrated with an IO board as discussed herein. Also, one or more of the components discussed herein can be embodied as a System On Chip (SOC) device. FIG. 8 illustrates a block diagram of an SOC package in accordance with an embodiment. As illustrated in FIG. 8, SOC 802 includes one or more Central Processing Unit (CPU) cores 820, one or more Graphics Processor Unit (GPU) cores 830, an Input/Output (I/O) interface 840, and a memory controller 842. Various components of the SOC package 802 may be coupled to an interconnect or bus such as discussed herein with reference to the other figures. Also, the SOC package 802 may include more or less components, such as those discussed herein with reference to the other figures. Further, each component of the SOC package 820 may include one or more other components, e.g., as discussed with reference to the other figures herein. In one embodiment, SOC package 802 (and its components) is provided on one or more Integrated Circuit (IC) die, e.g., which are packaged into a single semiconductor device.

As illustrated in FIG. 8, SOC package 802 is coupled to a memory 860 via the memory controller 842. In an embodiment, the memory 860 (or a portion of it) can be integrated on the SOC package 802.

The I/O interface 840 may be coupled to one or more I/O devices 870, e.g., via an interconnect and/or bus such as discussed herein with reference to other figures. I/O device(s) 870 may include one or more of a keyboard, a mouse, a touchpad, a display, an image/video capture device (such as a camera or camcorder/video recorder), a touch screen, a speaker, or the like.

Figure 9:
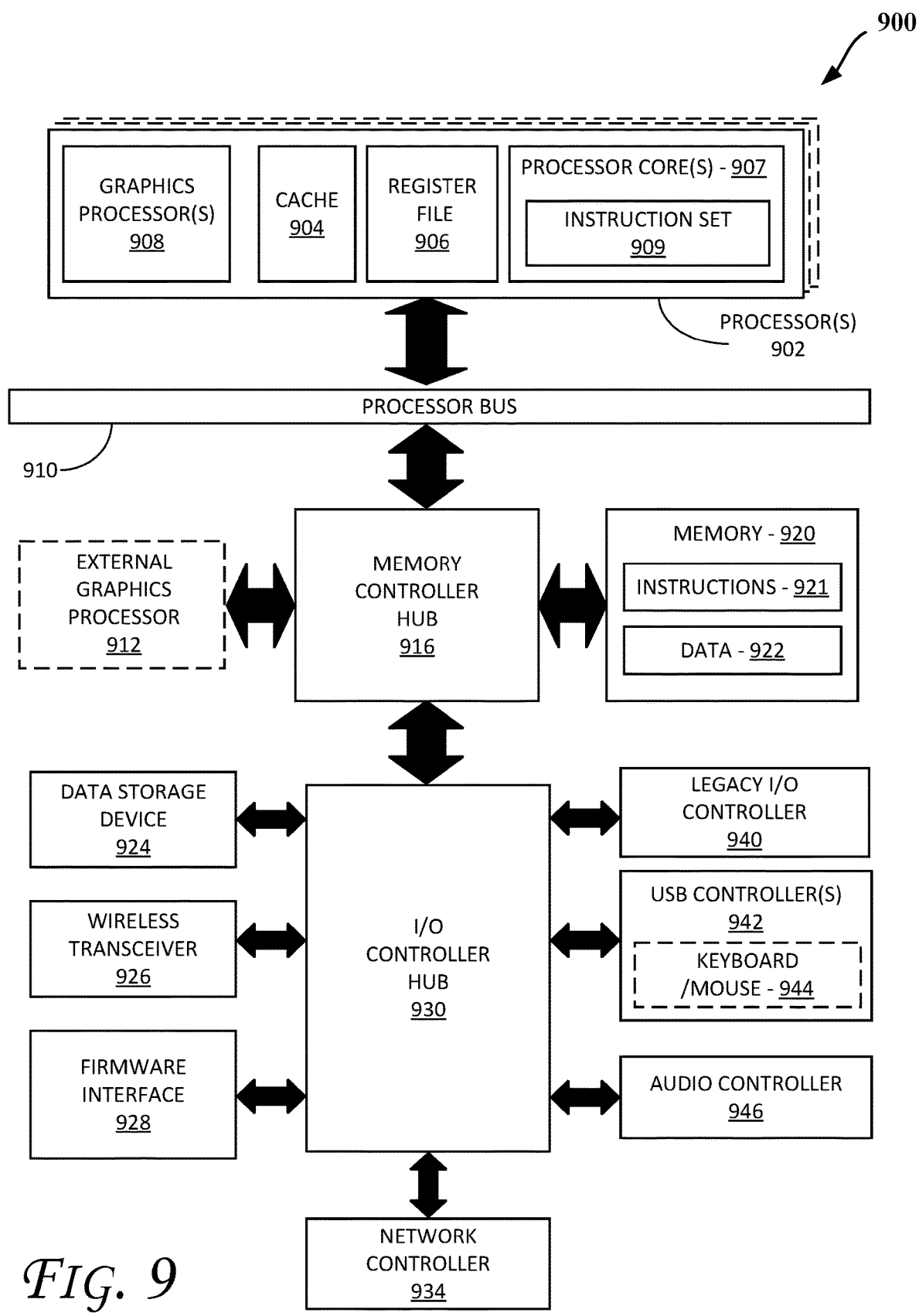

FIG. 9 is a block diagram of a processing system 900, according to an embodiment. In various embodiments the system 900 includes one or more processors 902 and one or more graphics processors 908, and may be a single processor desktop system, a multiprocessor workstation system, or a server system having a large number of processors 902 or processor cores 907. In on embodiment, the system 900 is a processing platform incorporated within a system-on-a-chip (SoC) integrated circuit for use in mobile, handheld, or embedded devices.

An embodiment of system 900 can include, or be incorporated within a server-based gaming platform, a game console, including a game and media console, a mobile gaming console, a handheld game console, or an online game console. In some embodiments system 900 is a mobile phone, smart phone, tablet computing device or mobile Internet device. Data processing system 900 can also include, couple with, or be integrated within a wearable device, such as a smart watch wearable device, smart eyewear device, augmented reality device, or virtual reality device. In some embodiments, data processing system 900 is a television or set top box device having one or more processors 902 and a graphical interface generated by one or more graphics processors 908.

In some embodiments, the one or more processors 902 each include one or more processor cores 907 to process instructions which, when executed, perform operations for system and user software. In some embodiments, each of the one or more processor cores 907 is configured to process a specific instruction set 909. In some embodiments, instruction set 909 may facilitate Complex Instruction Set Computing (CISC), Reduced Instruction Set Computing (RISC), or computing via a Very Long Instruction Word (VLIW). Multiple processor cores 907 may each process a different instruction set 909, which may include instructions to facilitate the emulation of other instruction sets. Processor core 907 may also include other processing devices, such a Digital Signal Processor (DSP).

In some embodiments, the processor 902 includes cache memory 904. Depending on the architecture, the processor 902 can have a single internal cache or multiple levels of internal cache. In some embodiments, the cache memory is shared among various components of the processor 902. In some embodiments, the processor 902 also uses an external cache (e.g., a Level-3 (L3) cache or Last Level Cache (LLC)) (not shown), which may be shared among processor cores 907 using known cache coherency techniques. A register file 906 is additionally included in processor 902 which may include different types of registers for storing different types of data (e.g., integer registers, floating point registers, status registers, and an instruction pointer register). Some registers may be general-purpose registers, while other registers may be specific to the design of the processor 902.

In some embodiments, processor 902 is coupled to a processor bus 910 to transmit communication signals such as address, data, or control signals between processor 902 and other components in system 900. In one embodiment the system 900 uses an exemplary 'hub' system architecture, including a memory controller hub 916 and an Input Output (I/O) controller hub 930. A memory controller hub 916 facilitates communication between a memory device and other components of system 900, while an I/O Controller Hub (ICH) 930 provides connections to I/O devices via a local I/O bus. In one embodiment, the logic of the memory controller hub 916 is integrated within the processor.

Memory device 920 can be a dynamic random access memory (DRAM) device, a static random access memory (SRAM) device, flash memory device, phase-change memory device, or some other memory device having suitable performance to serve as process memory. In one embodiment the memory device 920 can operate as system memory for the system 900, to store data 922 and instructions 921 for use when the one or more processors 902 executes an application or process. Memory controller hub 916 also couples with an optional external graphics processor 912, which may communicate with the one or more graphics processors 908 in processors 902 to perform graphics and media operations.

In some embodiments, ICH 930 enables peripherals to connect to memory device 920 and processor 902 via a high-speed I/O bus. The I/O peripherals include, but are not limited to, an audio controller 946, a firmware interface 928, a wireless transceiver 926 (e.g., Wi-Fi, Bluetooth), a data storage device 924 (e.g., hard disk drive, flash memory, etc.), and a legacy I/O controller 940 for coupling legacy (e.g., Personal System 2 (PS/2)) devices to the system. One or more Universal Serial Bus (USB) controllers 942 connect input devices, such as keyboard and mouse 944 combinations. A network controller 934 may also couple to ICH 930. In some embodiments, a high-performance network controller (not shown) couples to processor bus 910. It will be appreciated that the system 900 shown is exemplary and not limiting, as other types of data processing systems that are differently configured may also be used. For example, the I/O controller hub 930 may be integrated within the one or more processor 902, or the memory controller hub 916 and I/O controller hub 930 may be integrated into a discreet external graphics processor, such as the external graphics processor 912.

Figure 10:
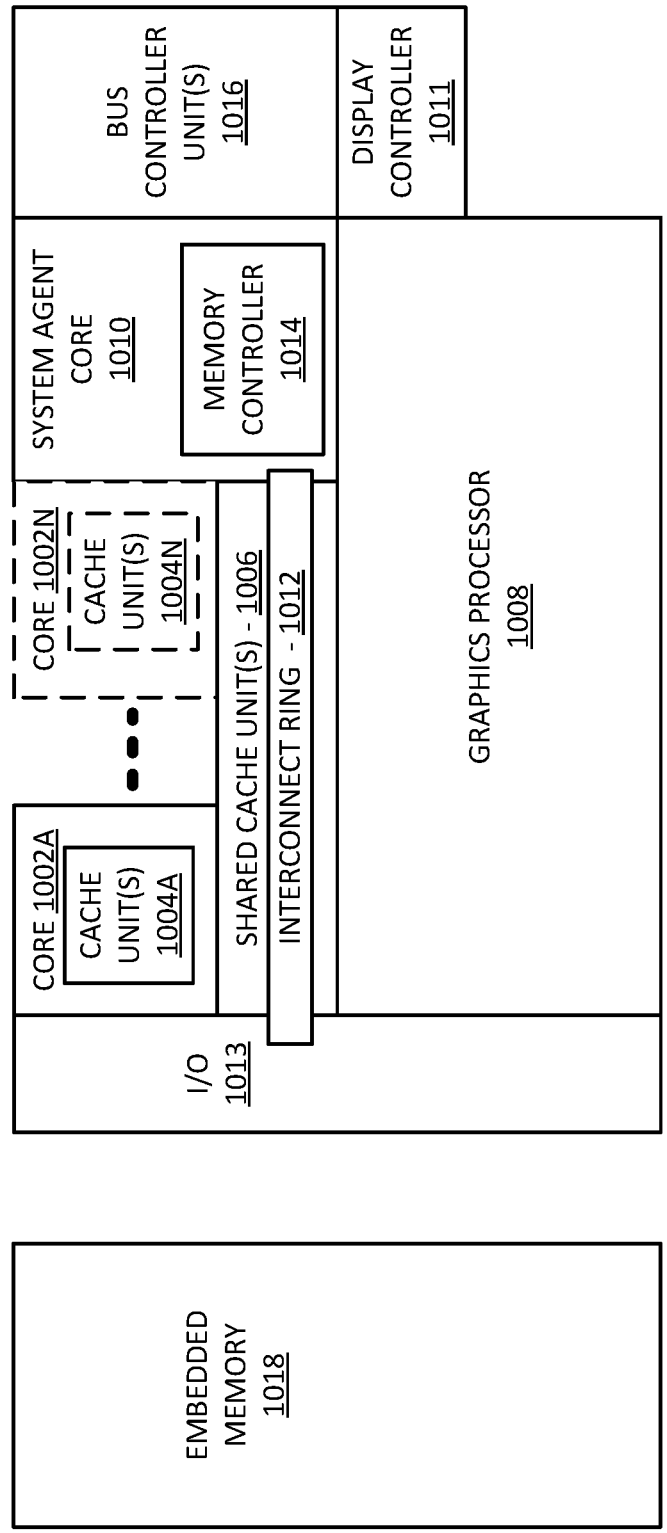
FIGS. 10 and 11 illustrate various components of processers in accordance with some embodiments.

FIG. 10 is a block diagram of an embodiment of a processor 1000 having one or more processor cores 1002A-1002N, an integrated memory controller 1014, and an integrated graphics processor 1008. Those elements of FIG. 10 having the same reference numbers (or names) as the elements of any other figure herein can operate or function in any manner similar to that described elsewhere herein, but are not limited to such. Processor 1000 can include additional cores up to and including additional core 1002N represented by the dashed lined boxes. Each of processor cores 1002A-1002N includes one or more internal cache units 1004A-1004N. In some embodiments each processor core also has access to one or more shared cached units 1006.

The internal cache units 1004A-1004N and shared cache units 1006 represent a cache memory hierarchy within the processor 1000. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1006 and 1004A-1004N.

In some embodiments, processor 1000 may also include a set of one or more bus controller units 1016 and a system agent core 1010. The one or more bus controller units 1016 manage a set of peripheral buses, such as one or more Peripheral Component Interconnect buses (e.g., PCI, PCI Express). System agent core 1010 provides management functionality for the various processor components. In some embodiments, system agent core 1010 includes one or more integrated memory controllers 1014 to manage access to various external memory devices (not shown).

In some embodiments, one or more of the processor cores 1002A-1002N include support for simultaneous multi-threading. In such embodiment, the system agent core 1010 includes components for coordinating and operating cores 1002A-1002N during multi-threaded processing. System agent core 1010 may additionally include a power control unit (PCU), which includes logic and components to regulate the power state of processor cores 1002A-1002N and graphics processor 1008.

In some embodiments, processor 1000 additionally includes graphics processor 1008 to execute graphics processing operations. In some embodiments, the graphics processor 1008 couples with the set of shared cache units 1006, and the system agent core 1010, including the one or more integrated memory controllers 1014. In some embodiments, a display controller 1011 is coupled with the graphics processor 1008 to drive graphics processor output to one or more coupled displays. In some embodiments, display controller 1011 may be a separate module coupled with the graphics processor via at least one interconnect, or may be integrated within the graphics processor 1008 or system agent core 1010.

In some embodiments, a ring based interconnect unit 1012 is used to couple the internal components of the processor 1000. However, an alternative interconnect unit may be used, such as a point-to-point interconnect, a switched interconnect, or other techniques, including techniques well known in the art. In some embodiments, graphics processor 1008 couples with the ring interconnect 1012 via an I/O link 1013.

The exemplary I/O link 1013 represents at least one of multiple varieties of I/O interconnects, including an on package I/O interconnect which facilitates communication between various processor components and a high-performance embedded memory module 1018, such as an eDRAM (or embedded DRAM) module. In some embodiments, each of the processor cores 1002-1002N and graphics processor 1008 use embedded memory modules 1018 as a shared Last Level Cache.

In some embodiments, processor cores 1002A-1002N are homogenous cores executing the same instruction set architecture. In another embodiment, processor cores 1002A-1002N are heterogeneous in terms of instruction set architecture (ISA), where one or more of processor cores 1002A-1002N execute a first instruction set, while at least one of the other cores executes a subset of the first instruction set or a different instruction set. In one embodiment processor cores 1002A-1002N are heterogeneous in terms of microarchitecture, where one or more cores having a relatively higher power consumption couple with one or more power cores having a lower power consumption. Additionally, processor 1000 can be implemented on one or more chips or as an SoC integrated circuit having the illustrated components, in addition to other components.

Figure 11:
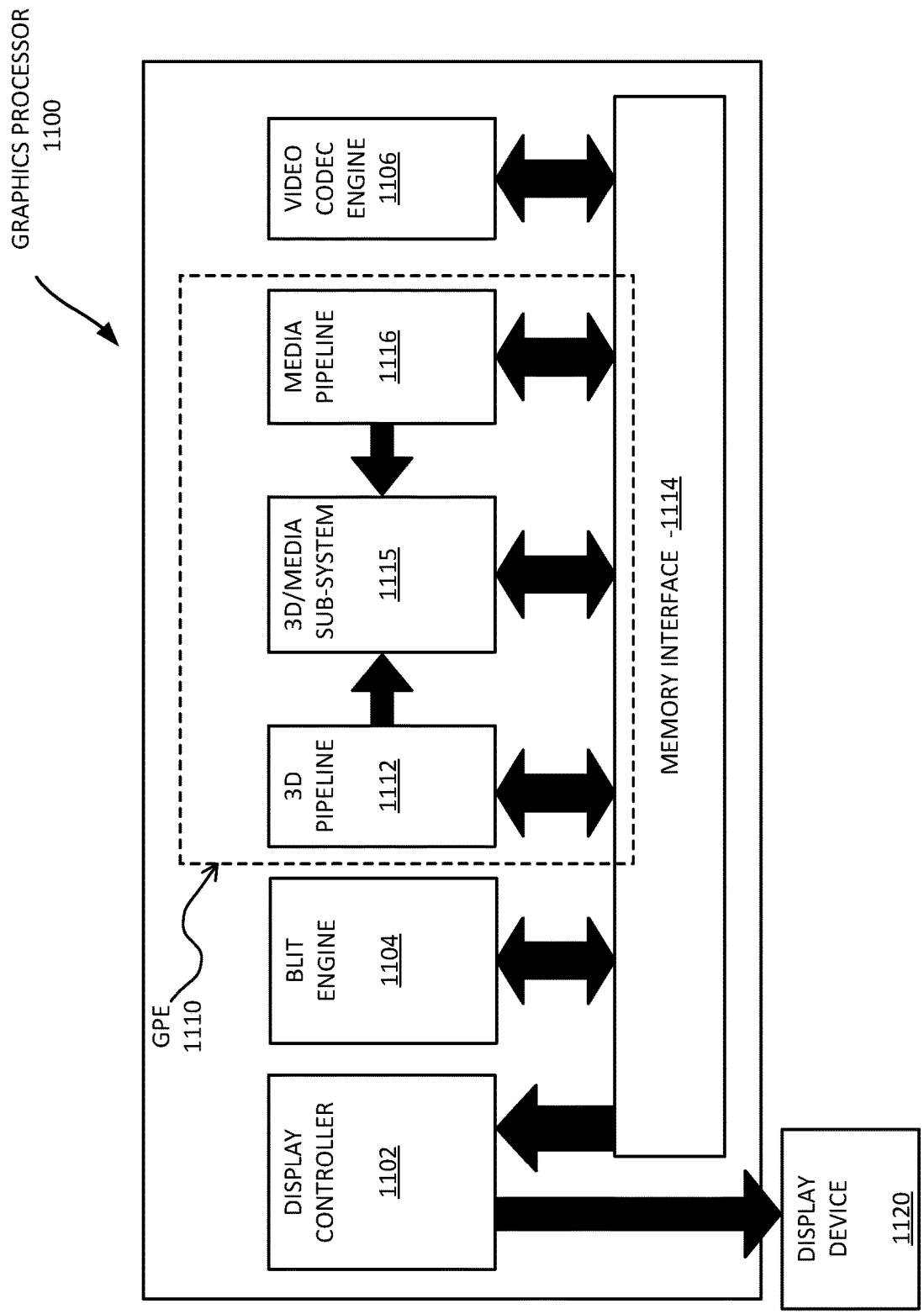

FIG. 11 is a block diagram of a graphics processor 1100, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 1100 includes a memory interface 1114 to access memory. Memory interface 1114 can be an interface to local memory, one or more internal caches, one or more shared external caches, and/or to system memory.

In some embodiments, graphics processor 1100 also includes a display controller 1102 to drive display output data to a display device 1120. Display controller 1102 includes hardware for one or more overlay planes for the display and composition of multiple layers of video or user interface elements. In some embodiments, graphics processor 1100 includes a video codec engine 1106 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 1100 includes a block image transfer (BLIT) engine 1104 to perform two-dimensional (2D) rasterizer operations including, for example, bit-boundary block transfers. However, in one embodiment, 11D graphics operations are performed using one or more components of graphics processing engine (GPE) 1110. In some embodiments, graphics processing engine 1110 is a compute engine for performing graphics operations, including three-dimensional (3D) graphics operations and media operations.

In some embodiments, GPE 1110 includes a 3D pipeline 1112 for performing 3D operations, such as rendering three-dimensional images and scenes using processing functions that act upon 3D primitive shapes (e.g., rectangle, triangle, etc.). The 3D pipeline 1112 includes programmable and fixed function elements that perform various tasks within the element and/or spawn execution threads to a 3D/Media sub-system 1115. While 3D pipeline 1112 can be used to perform media operations, an embodiment of GPE 1110 also includes a media pipeline 1116 that is specifically used to perform media operations, such as video post-processing and image enhancement.

In some embodiments, media pipeline 1116 includes fixed function or programmable logic units to perform one or more specialized media operations, such as video decode acceleration, video de-interlacing, and video encode acceleration in place of, or on behalf of video codec engine 1106. In some embodiments, media pipeline 1116 additionally includes a thread spawning unit to spawn threads for execution on 3D/Media sub-system 1115. The spawned threads perform computations for the media operations on one or more graphics execution units included in 3D/Media subsystem 1115.

In some embodiments, 3D/Media subsystem 1115 includes logic for executing threads spawned by 3D pipeline 1112 and media pipeline 1116. In one embodiment, the pipelines send thread execution requests to 3D/Media subsystem 1115, which includes thread dispatch logic for arbitrating and dispatching the various requests to available thread execution resources. The execution resources include an array of graphics execution units to process the 3D and media threads. In some embodiments, 3D/Media subsystem 1115 includes one or more internal caches for thread instructions and data. In some embodiments, the subsystem also includes shared memory, including registers and addressable memory, to share data between threads and to store output data.

The following examples pertain to further embodiments. Example 1 includes an apparatus comprising: a System in Package (SiP) board, wherein the SiP board is to comprise a plurality of logic components; and an Input Output (IO) board coupled to the SiP board via a grid array, wherein the plurality of logic components is to be provided on both a first side and a second side of the SiP board, wherein one or more of the plurality of logic components are to be positioned in an opening in the IO board. Example 2 includes the apparatus of example 1, wherein the grid array is to comprise one or more of: land grid array, ball grid array, pin grid array, and solder grid array. Example 3 includes the apparatus of any one of examples 1-2, wherein a height of the one or more of the plurality of logic components is not to exceed beyond a surface formed by a side of the IO board that faces away from a coupling formed by the grid array. Example 4 includes the apparatus of any one of examples 1-3, wherein the IO board is to comprise one or more logic components on a first side of the IO board, wherein the first side of the IO board is to be coupled to the SiP board via the grid array. Example 5 includes the apparatus of any one of examples 1-4, wherein the IO board is to comprise one or more logic components on a first side and a second side of the IO board. Example 6 includes the apparatus of any one of examples 1-5, wherein the first side of the SiP board is to comprise all of the plurality of logic components with a lower profile and the second side of the SiP board is to comprise all of the plurality of logic components with a taller profile. Example 7 includes the apparatus of any one of examples 1-6, wherein the IO board is to comprise one or more logic components on a first side and a second side of the IO board, wherein the first side of the IO board is to comprise all of the one or more logic components with a lower profile and the second side of the IO board is to comprise all of the one or more logic components with a taller profile. Example 8 includes the apparatus of any one of examples 1-7, wherein the first side of the SiP board is to comprise all of the plurality of logic components with a lower profile and the second side of the SiP board is to comprise all of the plurality of logic components with a taller profile, wherein the IO board is to comprise one or more logic components on a first side and a second side of the IO board, wherein the first side of the IO board is to comprise all of the one or more logic components with a lower profile and the second side of the IO board is to comprise all of the one or more logic components with a taller profile, wherein the first side of the SiP board is to face the same direction as the first side of the IO board. Example 9 includes the apparatus of any one of examples 1-8, wherein the grid array is to be provided on a periphery of the SiP board. Example 10 includes the apparatus of any one of examples 1-9, wherein the SiP board is to comprise a plurality of signal pins on both sides of the SiP board. Example 11 includes the apparatus of any one of examples 1-10, wherein the SiP board is to comprise a plurality of signal pins on both sides of the SiP board, wherein at least one of the plurality of signal pins is to be provided on both sides of the SiP board. Example 12 includes the apparatus of any one of examples 1-11, further comprising one or more flex cables to electrically couple at least two of the plurality of logic components. Example 13 includes the apparatus of any one of examples 1-12, further comprising one or more flex cables to electrically couple at least one of the plurality of logic components with a logic component on the IO board. Example 14 includes the apparatus of any one of examples 1-13, further comprising one or more flex cables to electrically couple at least one of the plurality of logic components with another logic component. Example 15 includes the apparatus of any one of examples 1-14, wherein the plurality of logic components is to comprise one or more of: a Graphics Processing Unit (GPU), a Central Processing Unit (CPU), memory, power management integrated circuit, one or more inductors, a peripheral control hub, one or more integrated circuit devices, a voltage regulator, a power charger, one or more battery connectors, a wireless communication device, a serial peripheral interface, and a Bluetooth device. Example 16 includes the apparatus of any one of examples 1-15, wherein the CPU or the GPU is to comprise one or more processor cores. Example 17 includes the apparatus of any one of examples 1-16, wherein the IO board is to comprise one or more logic components selected from a group comprising: non-volatile memory, solid state drive, one or more sensors, a camera, a wireless communication device, and a Bluetooth device.

Example 18 includes a method comprising: providing a System in Package (SiP) board, wherein the SiP board comprises a plurality of logic components; and wherein an Input Output (IO) board is coupled to the SiP board via a grid array, wherein the plurality of logic components are provided on both a first side and a second side of the SiP board, wherein one or more of the plurality of logic components are positioned in an opening in the IO board. Example 19 includes the method of example 18, wherein the grid array comprises one or more of: land grid array, ball grid array, pin grid array, and solder grid array. Example 20 includes the method of any one of examples 18-19, wherein a height of the one or more of the plurality of logic components is not to exceed beyond a surface formed by a side of the IO board that faces away from a coupling formed by the grid array. Example 21 includes the method of any one of examples 18-20, wherein the IO board comprises one or more logic components on a first side of the IO board, wherein the first side of the IO board is coupled to the SiP board via the grid array. Example 22 includes the method of any one of examples 18-21, wherein the IO board comprises one or more logic components on a first side and a second side of the IO board. Example 23 includes the method of any one of examples 18-22, wherein the first side of the SiP board comprises all of the plurality of logic components with a lower profile and the second side of the SiP board comprises all of the plurality of logic components with a taller profile. Example 24 includes a computer-readable medium comprising one or more instructions that when executed on a processor configure the processor to perform one or more operations of any one of examples 18 to 23. Example 25 includes an apparatus comprising means to perform a method as set forth in any one of examples 18 to 23.

Example 26 includes a computing system comprising: a battery to provide electrical power to one or more components of the computing system; and a System in Package (SiP) board, wherein the SiP board is to comprise a plurality of logic components; and an Input Output (IO) board coupled to the SiP board via a grid array, wherein the plurality of logic components is to be provided on both a first side and a second side of the SiP board, wherein one or more of the plurality of logic components are to be positioned in an opening in the IO board. Example 27 includes the system of example 26, wherein the grid array is to comprise one or more of: land grid array, ball grid array, pin grid array, and solder grid array. Example 28 includes the system of any one of examples 26-27, wherein a height of the one or more of the plurality of logic components is not to exceed beyond a surface formed by a side of the IO board that faces away from a coupling formed by the grid array. Example 29 includes the system of any one of examples 26-28, wherein the IO board is to comprise one or more logic components on a first side of the IO board, wherein the first side of the IO board is to be coupled to the SiP board via the grid array. Example 30 includes the system of any one of examples 26-29, wherein the IO board is to comprise one or more logic components on a first side and a second side of the IO board. Example 31 includes the system of any one of examples 26-30, wherein the first side of the SiP board is to comprise all of the plurality of logic components with a lower profile and the second side of the SiP board is to comprise all of the plurality of logic components with a taller profile. Example 32 includes the system of any one of examples 26-31, wherein the IO board is to comprise one or more logic components on a first side and a second side of the IO board, wherein the first side of the IO board is to comprise all of the one or more logic components with a lower profile and the second side of the IO board is to comprise all of the one or more logic components with a taller profile. Example 33 includes the system of any one of examples 26-32, wherein the first side of the SiP board is to comprise all of the plurality of logic components with a lower profile and the second side of the SiP board is to comprise all of the plurality of logic components with a taller profile, wherein the IO board is to comprise one or more logic components on a first side and a second side of the IO board, wherein the first side of the IO board is to comprise all of the one or more logic components with a lower profile and the second side of the IO board is to comprise all of the one or more logic components with a taller profile, wherein the first side of the SiP board is to face the same direction as the first side of the IO board. Example 34 includes the system of any one of examples 26-33, wherein the grid array is to be provided on a periphery of the SiP board. Example 35 includes the system of any one of examples 26-34, wherein the SiP board is to comprise a plurality of signal pins on both sides of the SiP board. Example 36 includes the system of any one of examples 26-35, wherein the SiP board is to comprise a plurality of signal pins on both sides of the SiP board, wherein at least one of the plurality of signal pins is to be provided on both sides of the SiP board. Example 37 includes the system of any one of examples 26-36, further comprising one or more flex cables to electrically couple at least two of the plurality of logic components. Example 38 includes the system of any one of examples 26-37, further comprising one or more flex cables to electrically couple at least one of the plurality of logic components with a logic component on the IO board.

Example 39 includes an apparatus comprising means to perform a method as set forth in any preceding example. Example 40 comprises machine-readable storage including machine-readable instructions, when executed, to implement a method or realize an apparatus as set forth in any preceding example.

In various embodiments, the operations discussed herein, e.g., with reference to FIGS. 1-11, may be implemented as hardware (e.g., logic circuitry), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIGS. 1-11.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A computing system comprising:
a processor having one or more processor cores;
a System in Package (SiP) board, wherein the SiP board comprises a plurality of logic components, wherein the plurality of logic components comprises the processor; and
an Input Output (IO) board coupled to the SiP board via a grid array,
wherein the plurality of logic components is to be provided on both a first side and a second side of the SiP board, wherein one or more of the plurality of logic components are to be positioned in an opening in the IO board, wherein at least one flexible cable is to couple one or more logic components on a second board to a first side of the SiP board to allow the one or more logic components of the second board to be folded in between one or more components on a second side of the SiP board.

2. The computing system of claim 1, wherein the grid array comprises one or more of: land grid array, ball grid array, pin grid array, and solder grid array.

3. The computing system of claim 1, wherein a height of the one or more of the plurality of logic components is not to exceed beyond a surface formed by a side of the IO board that faces away from a coupling formed by the grid array.

4. The computing system of claim 1, wherein the IO board comprises a second set of one or more logic components on a first side of the IO board, wherein the first side of the IO board is to be coupled to the SiP board via the grid array.

5. The computing system of claim 1, wherein the IO board comprises a second set of one or more logic components on a first side and a second side of the IO board.

6. The computing system of claim 1, wherein the first side of the SiP board comprises all of the plurality of logic components with a lower profile and the second side of the SiP board comprises all of the plurality of logic components with a taller profile.

7. The computing system of claim 1, wherein the IO board comprises a second set of one or more logic components on a first side and a second side of the IO board, wherein the first side of the IO board comprises all of the second set of one or more logic components with a lower profile and the second side of the IO board comprises all of the second set of one or more logic components with a taller profile.

8. The computing system of claim 1, wherein the first side of the SiP board comprises the plurality of logic components with a lower profile and the second side of the SiP board comprises the plurality of logic components with a taller profile, wherein the IO board comprises a second set of one or more logic components on a first side and a second side of the IO board, wherein the first side of the IO board comprises all of the second set of one or more logic components with a lower profile and the second side of the IO board comprises all of the second set of one or more logic components with a taller profile, wherein the first side of the SiP board is to face the same direction as the first side of the IO board.

9. The computing system of claim 1, wherein the grid array is to be provided on a periphery of the SiP board.

10. The computing system of claim 1, wherein the SiP board comprises a plurality of signal pins on both sides of the SiP board.

11. The computing system of claim 1, wherein the SiP board comprises a plurality of signal pins on both sides of the SiP board, wherein at least two of the plurality of signal pins are to provide a same signal on both sides of the SiP board.

12. The computing system of claim 1, further comprising one or more flex cables to electrically couple at least two of the plurality of logic components.

13. The computing system of claim 1, further comprising one or more flex cables to electrically couple at least one of the plurality of logic components with a logic component on the IO board.

14. The computing system of claim 1, further comprising one or more flex cables to electrically couple at least one of the plurality of logic components with another logic component.

15. The computing system of claim 1, wherein the plurality of logic components comprises the processor and one or more of: a Graphics Processing Unit (GPU), a Central Processing Unit (CPU), memory, power management integrated circuit, one or more inductors, a peripheral control hub, one or more integrated circuit devices, a voltage regulator, a power charger, one or more battery connectors, a wireless communication device, a serial peripheral interface, and a Bluetooth device.

16. The computing system of claim 15, wherein the CPU or the GPU comprises one or more processor cores.

17. The computing system of claim 1, wherein the IO board comprise a second set of one or more logic components selected from a group comprising: non-volatile memory, solid state drive, one or more sensors, a camera, a wireless communication device, and a Bluetooth device.

\* \* \* \* \*